US007030677B2

(12) United States Patent
Pannwitz

(10) Patent No.: US 7,030,677 B2
(45) Date of Patent: Apr. 18, 2006

(54) FREQUENCY COMPENSATION SCHEME FOR LOW DROP OUT VOLTAGE REGULATORS USING ADAPTIVE BIAS

(75) Inventor: Axel Pannwitz, Lenningen (DE)

(73) Assignee: Dialog Semiconductor GmbH, Kirchheim/Teok-Nabern (DE)

( * ) Notice: Subject to any disclaimer, the term of this patent is extended or adjusted under 35 U.S.C. 154(b) by 89 days.

(21) Appl. No.: 10/706,837

(22) Filed: Nov. 12, 2003

(65) Prior Publication Data

US 2005/0040799 A1 Feb. 24, 2005

(30) Foreign Application Priority Data

Aug. 22, 2003 (EP) .................................. 03368082

(51) Int. Cl.
*H03K 5/08* (2006.01)

(52) U.S. Cl. ...................... 327/314; 327/105; 327/541; 323/281; 323/274

(58) Field of Classification Search ................ 323/274, 323/275, 279, 280, 281, 282, 288, 270, 272, 323/278; 363/84, 89, 91; 307/43, 49, 77, 307/63; 315/307, 308; 219/288, 289; 327/538, 327/541, 314, 105
See application file for complete search history.

(56) References Cited

U.S. PATENT DOCUMENTS 4,611,154 A * 9/1986 Lambropoulos et al. .... 318/490
6,222,412 B1 * 4/2001 Jeon et al. .................. 327/320
6,246,221 B1 6/2001 Xi .............................. 323/280
6,518,737 B1 2/2003 Stanescu et al. ............ 323/280
6,603,292 B1 8/2003 Schouten et al. ........... 323/277
2002/0130646 A1 9/2002 Zadeh et al. ................ 323/275

FOREIGN PATENT DOCUMENTS

EP 779568 A2 6/1997
EP 862102 A1 9/1998

OTHER PUBLICATIONS

Co-pending U.S. Appl. No. 10/347,983, filed Jan. 21, 2003, same assignee, "Regulated Cascade Structure for Voltage Regulators,".

* cited by examiner

*Primary Examiner*—Rajnikant B. Patel
(74) *Attorney, Agent, or Firm*—George D. Saile; Stephen B. Ackerman

(57) ABSTRACT

A method and circuits to improve the stability of low dropout voltage regulators having an adaptive biased driving stage. Said improvement of stabilization is valid through the total range of output current possible. A serial impedance is added to the gate capacitance of the PMOS pass device of said LDO. Said serial impedance could be a resistor or a transistor. In case of low load currents said impedance is not dominating, for high load currents said impedance keeps the gate pole close to the resonance frequency of the output tank. In case of medium load currents, wherein the inner resistance of the driving stage is about equal to said serial impedance, the gate pole could get too low. This problem is solved by reducing said serial impedance by shunting. Said shunting can be performed stepwise depending on the size of the load current. A special circuitry detects the condition of medium load currents and can initialize the shunting of said serial impedance accordingly in order to keep the gate pole on the optimum frequency.

23 Claims, 7 Drawing Sheets

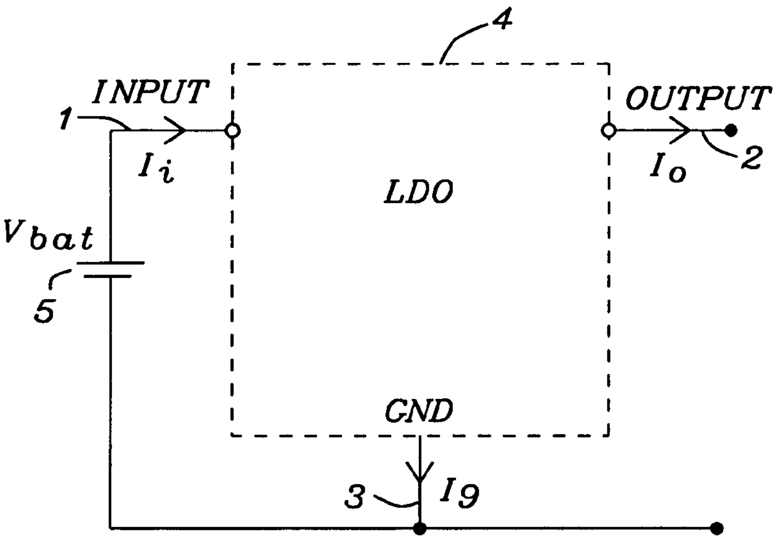
FIG. 1 – Prior Art
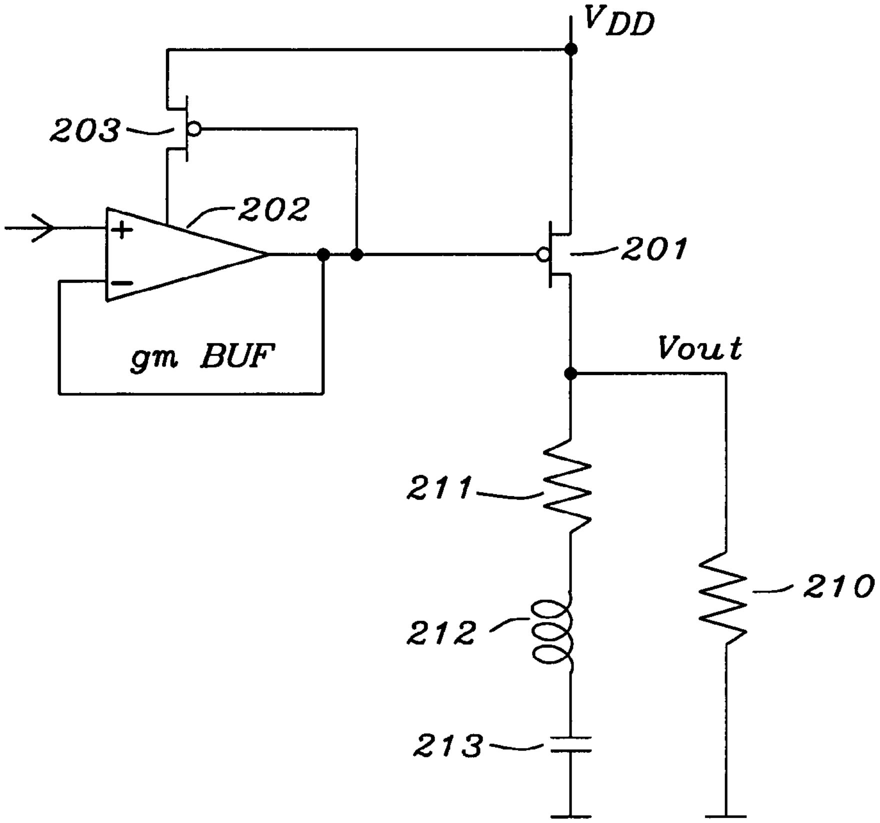
FIG. 2 – Prior Art

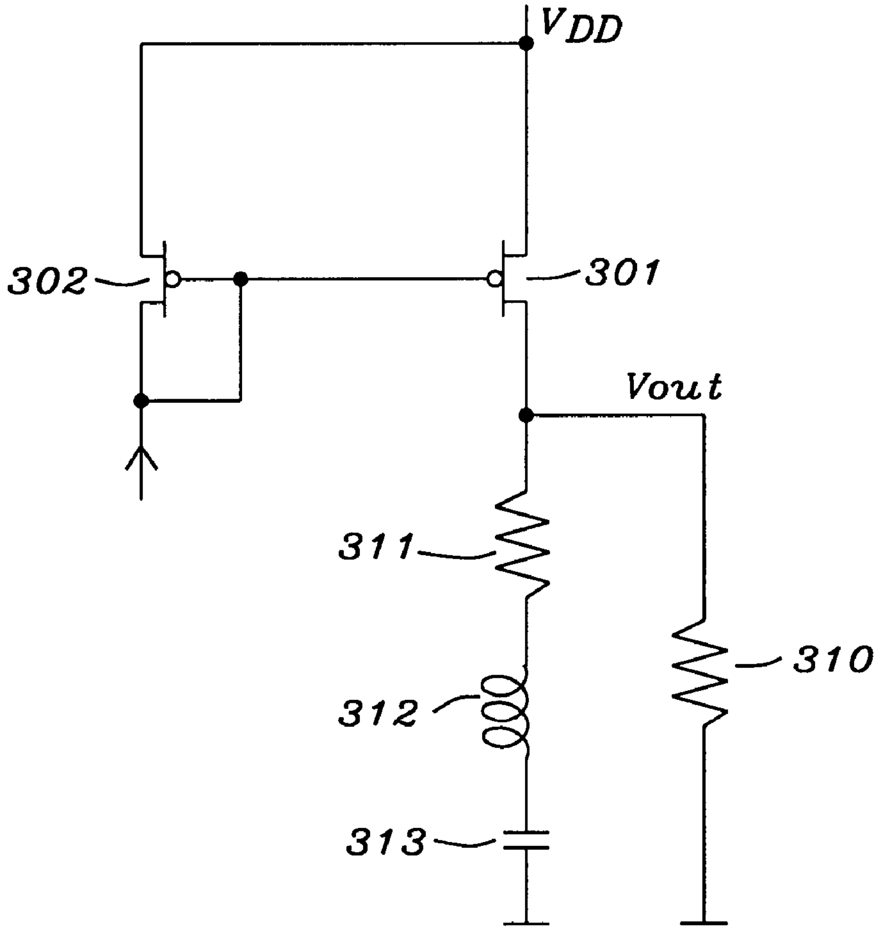
FIG. 3 – Prior Art

FREQUENCY COMPENSATION SCHEME FOR LOW DROP OUT VOLTAGE REGULATORS USING ADAPTIVE BIAS

This application is related to U.S. patent application Ser. No. 10/347,983, filed on Jan. 21, 2003, and assigned to the same assignee as the present invention.

BACKGROUND OF THE INVENTION (1) Field of the Invention

This invention relates generally to voltage regulators, and more particularly to an enhancement of low dropout voltage regulators having an adaptive biased driving stage in order to improve stability through a very wide range of output current.

(2) Description of the Prior Art

Low-dropout (LDO) linear regulators are commonly used to provide power to low-voltage digital and analog circuits, where point-of-load and line regulation is important. FIG. 1 prior art shows a typical basic circuit of a LDO regulator 3 having an input voltage $V_i$ 1, an output voltage $V_o$ 2, an input current $I_i$ and an output current $I_o$.

Conventional LDO regulators are very problematic in the area of transient response. Transient response is the behavioral of the regulator after a abrupt change of either the load current (load response) or the input voltage (line response). A minimum under and overshoot of the regulated voltage and a fast settling is desired. The transient response is defined by the frequency compensation of the regulation loop. Voltage regulators are difficult to compensate because of the fact that the load resistance and with this the output pole can vary over a wide range. For zero load the load resistance is infinite and the output pole is zero Hz. For maximum load the load resistance is at its minimum and the output pole is as its maximum, that might be a few KHz.

Said frequency compensation is still a challenge for the designers of LDO regulators U.S. Patent (U.S. Pat. No. 6,246,221 to Xi.) describes a high power supply ripple rejection (PSRR) internally compensated low drop-out (LDO) voltage regulator using an output PMOS pass device. The voltage regulator uses a non-inversion variable gain amplifier stage to adjust its gain in response to a load current passing through the output PMOS device such that as the load current decreases, the gain increases, wherein a second pole associated with the voltage regulator is pushed above a unity gain frequency associated with the voltage regulator.

FIG. 2 prior art shows a simplified circuit of an embodiment of a PMOS LDO according to said U.S. Pat. No. 6,246,221 to Xi. Said regulator is a multiple-loop regulator. Said circuit comprises a gm-buffer amplifier 202 to push the gate pole of the PMOS pass device 201 to high frequencies. Transistor 203 serves for adaptive biasing the gm-buffer amplifier 202. 211 represents the equivalent series resistance (ESR) of the load capacitor 213. 212 represents the equivalent series inductance (ESL) of the load capacitor 213. In case of low loads the out-pole formed by the load capacitor 213 and the load resistance 210 goes to low frequencies and thus it is possible to lower the gate-pole also.

In the U.S. patent application Ser. No. 10/347,983, filed on Jan. 21, 2003, a LDO is described having an error amplifier as part of a current mirror output stage. A method and a circuit to achieve a low dropout voltage regulator having a constant high performance under all operating conditions, including the dropout region, has been disclosed in said patent application. A regulated cascade structure is placed at the input of a current mirror and in connection with a voltage regulator output stage. In contrast to other applications the positive input of the error amplifier is not biased with a reference voltage but connected to the regulator output. Therefore the cascade structure regulates the voltage of the entry node of the current mirror to be equal to the output voltage of the regulator under all operating conditions of the regulator. Thus the transistors of the current mirror have always identical drain-source voltages. Therefore the regulator is kept in the optimal, balanced operating point, a constant high regulator loop gain is achieved and PSRR and load regulation performance is no more reduced under dropout operating conditions.

FIG. 3 prior art shows a simplified circuit of an embodiment of a LDO according to said U.S. patent application Ser. No. 10/347,983, filed on Jan. 21, 2003. 302 is the input transistor of a current mirror formed by PMOS pass device 301 and said input transistor 302. Equivalent to FIG. 2 prior art 311 represents the equivalent series resistance (ESR) of the filter capacitor 313. 312 represents again the equivalent series inductance (ESL) of the filter capacitor 313. 310 represents the load resistance of said LDO again. In said embodiment the gate-pole of the PMOS pass device 301 moves in a constant ratio with the out-pole. Said gate-pole of the pass device is formed by the gate capacity $C_{gate}$ of transistor 301 and 1/gm of the input transistor 302, wherein gm represents the transconductance gain of transistor 302. Said out-pole is formed by the load resistance 310 and the load capacitor 313.

There are additional patents dealing with the stabilization of LDOs.

U.S. Patent Application Publication 2002/0130646 (to Zadeh et al.) describes a linear voltage regulator, such as a low-dropout regulator, supplying power to one or more digital circuits within a computer system. The low-dropout regulator provides a substantially constant output voltage independent of loading conditions. The low-dropout regulator is biased at a relatively low operating current for steady-state operation to improve power efficiency of the low-dropout regulator. During a loading condition change, an adaptive biasing circuit senses the loading condition change and provides additional biasing current to momentarily increase the operating current of the low-dropout regulator to improve transient response.

SUMMARY OF THE INVENTION

A principal object of the present invention is to improve the stability of low dropout voltage regulators (LDO) having an adaptive biased driving stage.

A further object of the present invention is to keep the current consumption of said LDOs at a minimum.

In accordance with the objects of this invention a circuit to improve the stability of a low drop-out (LDO) voltage regulator has been achieved. Said circuit comprises a means of an adaptive biased driving stage of said LDO, an impedance being connected on one side to said means of an adaptive biased driving stage and on the other side to the gate of a pass device of said LDO, a pass device of said LDO, wherein its gate is connected to said impedance and the source and drain are connected to $V_{DD}$ voltage and to the output voltage of said LDO, and a filter capacitor being connected to ground and to the output voltage of said LDO.

In accordance with the objects of the invention a method to improve the stability of a low drop-out (LDO) voltage regulator has been achieved. Said method comprises first providing a pass device for an adaptive biased driving stage.

The steps of the method invented are to add a serial impedance to the gate capacitance of said pass device and to shunt partly said impedance in case of medium load currents as far as required.

BRIEF DESCRIPTION OF THE DRAWINGS

In the accompanying drawings forming a material part of this description, there is shown:

FIG. 1 prior art illustrates the principal currents of an LDO.

FIG. 2 prior art shows a LDO using a gm-buffer amplifier

FIG. 3 prior art shows a LDO using a current mirror.

DESCRIPTION OF THE PREFERRED EMBODIMENTS

The preferred embodiments disclose circuits and a method for enhancements of low drop-out (LDO) voltage regulators having adaptive biased driving stages in order to improve the stability of the regulation loop of said LDOs. Said embodiments of the present invention can be used e.g. in multiple loop regulators as disclosed in U.S. Pat. No. 6,246,221 and described in the prior art section of this application or can be used e.g. with LDOs using current mirrors.

In order to achieve stability of the regulation loop of said LDOs it is necessary that the gate pole, formed by the inner resistance of the driving stage and the gate capacitance of the PMOS pass device, is at least N times higher than the output pole formed by load resistance and the load capacitance.

N has to be equal or higher than the open-loop gain of the LDO. For example, if the open-loop gain is 60 dB, i.e. 1000, then N has to be higher than 1000. This statement is only valid as long the inductances can be neglected. Usually LDO circuits use capacitors having a capacitance in the order of magnitude of 1–3 μF. Said capacitors may have a serial inductance of about 1 nH. The PCB routing, the chip package and the bonding wires of the package may also have 1–20 nH inductance. Therefore the resonance frequency of the out "tank" is in the order of magnitude of 500 KHz to 3 MHz. For an adaptive biased gm-buffer, as described in FIG. 2 prior art, or an input of a current mirror, as described in FIG. 3 prior art, the LDO gets instable for high currents as explained below.

The problem of said prior art solutions is that for low loads and resulting low output poles the gate pole must be N times higher than the output pole. There is no impact of the serial inductance. For high currents the output pole goes up. In case the gate pole goes up in the same way (keeping the ratio of gate and output pole constant) the gate pole gets much higher than the resonance frequency of the output "tank". Above the resonance frequency the impedance of the output "tank" rises again and the phase shifts by 180 degrees. Thus the regulator gets instable.

Figure 4:
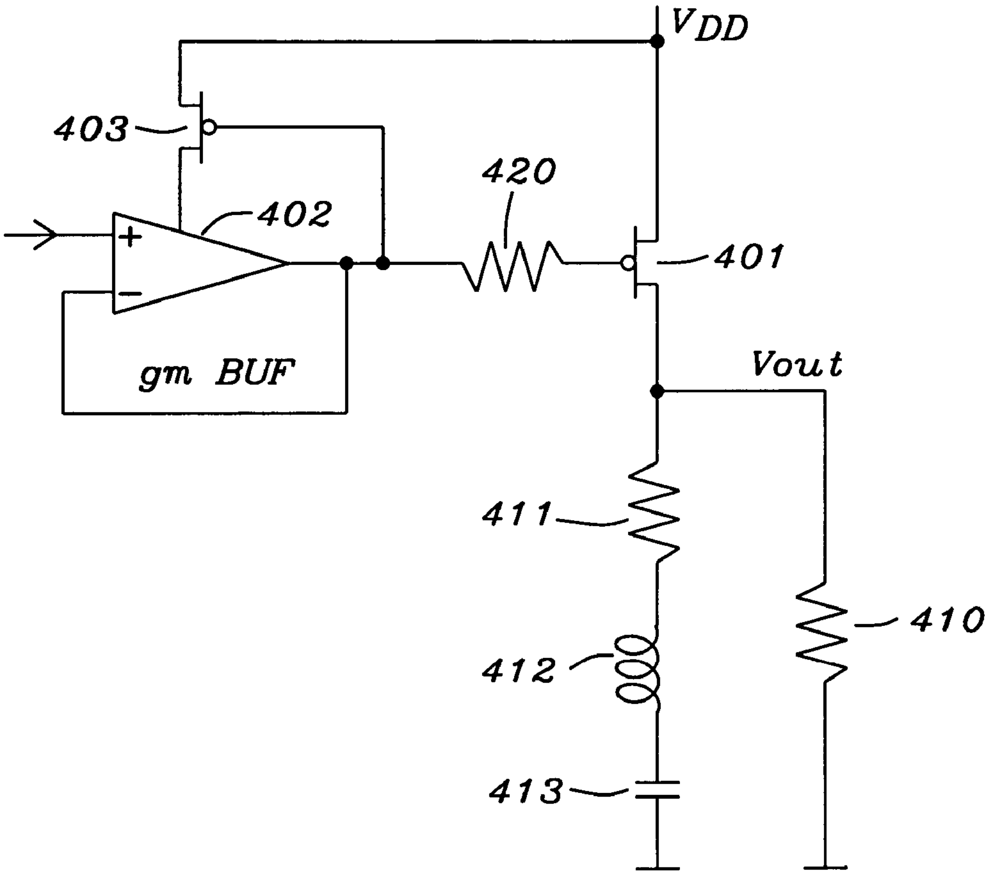
FIG. 4 shows an embodiment of the present invention with an LDO using a gm-buffer amplifier as driving stage.

As a key point of the present invention the moving gate pole, formed by the inner resistance of the adaptive biased driving stage and the gate capacitance of the PMOS pass device, is kept close to the resonance frequency for high load currents. It should be noted that a second, fixed pole close to the resonance frequency of the output "tank" is necessary to ensure regulation loop stability. This pole is usually formed at the output of the error amplifier (not shown here). FIG. 4 shows a preferred embodiment of the present invention. It shows a circuit of an LDO using an adaptive biased gm-buffer, similar to the circuit described in FIG. 2 prior art. In the circuit shown in FIG. 4 a gm-buffer 402 pushes the gate pole of the pass device 401 to high frequencies. Transistor 403 provides adaptive biasing of the gm-buffer 402. Resistor 411 represents the equivalent series resistance (ESR) of the filter capacitor 413. Inductor 412 represents the equivalent series inductance (ESL) of the filter capacitor 413. In case of low loads the output-pole formed by the load 410 and the capacitance 413 goes to low frequencies and it is therefore possible to lower the gate pole.

Said preferred embodiment shown in FIG. 4 is thus characterized that a serial resistor 420 is added to the gate capacitance. In said preferred embodiment of the present invention a resistor has been selected. Another kind of impedance, e.g. a transistor, besides a resistor could have been used as well. In case of low load the resistance of said resistor 420 is not dominating, in case of high load said resistance keeps the gate pole close to the resonance frequency of the output "tank", formed by the capacitor 413 and the equivalent series inductance (ESL) of the filter capacitor 413. Said resonance frequency $f_r$ is defined by the equation $$f_r = \frac{1}{2\times\pi\times\sqrt{L\times C}},$$

wherein L represents the equivalent series inductance (ESL) 412 and C represents the capacitance of the capacitor 413.

Figure 5:
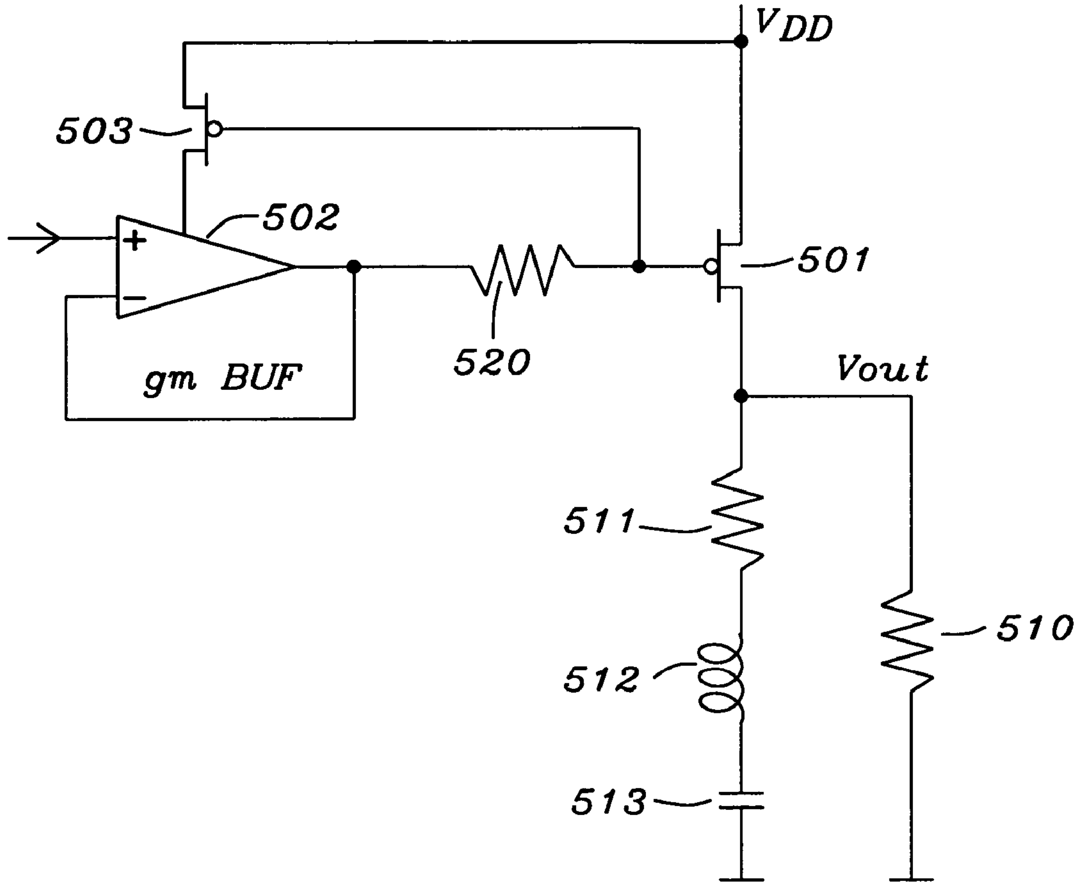
FIG. 5 shows another embodiment of the present invention with an LDO using a gm-buffer amplifier as driving stage.

FIG. 5 shows another embodiment of the present invention: Said circuit shown in FIG. 5 is similar to the circuit shown in FIG. 4. FIG. 5 shows again a circuit of an LDO using an adaptive biased gm-buffer, similar to the circuit described in FIG. 2 prior art. In the circuit shown in FIG. 5 a gm-buffer 502 pushes the gate pole of the pass device 501 to high frequencies. Transistor 503 provides adaptive biasing of the gm-buffer 502. Resistor 511 represents the equivalent series resistance (ESR) of the filter capacitor 513. Inductor 512 represents the equivalent series inductance (ESL) of the filter capacitor 513.

Said preferred embodiment shown in FIG. 5 is thus characterized that a serial resistor 520 is added to the to the gate capacitance and, differentiating from the circuit shown in FIG. 4. the adaptive biasing transistor 503 is connected to the gate of the pass device 501 and not, as shown in FIG. 4, to the output of the adaptive biased gm-buffer. There is no difference in functionality between the circuit shown in FIG. 4 and the circuit shown in FIG. 5.

Figure 6:
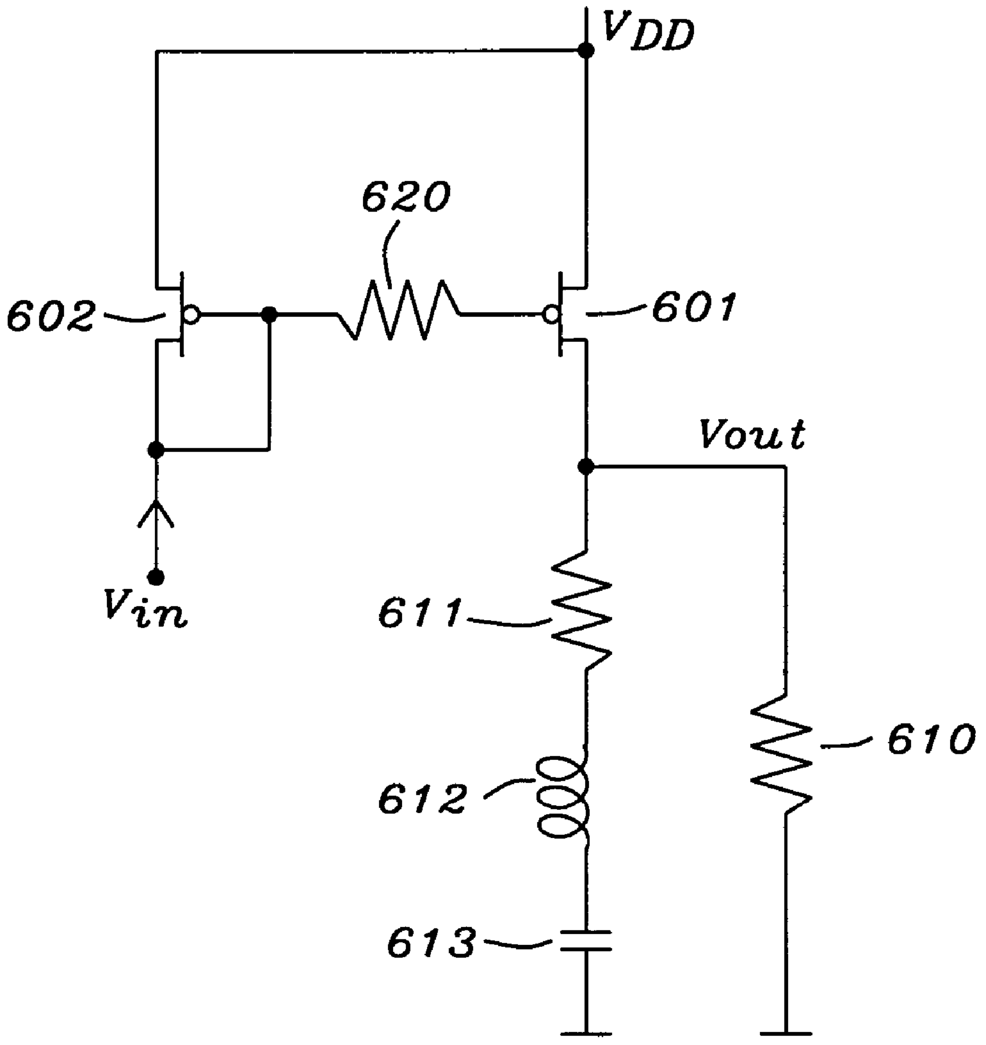
FIG. 6 shows an embodiment of the present invention with an LDO using a current mirror as driving stage.

FIG. 6 shows another embodiment of the present invention: Said circuit shown in FIG. 6 is similar to the circuit shown in FIG. 3 prior art. FIG. 6 shows also a circuit of an LDO using a current mirror. 602 is the input transistor of a current mirror formed by PMOS pass device 601 and said input transistor 602. Resistor 611 represents the equivalent series resistance (ESR) of the filter capacitor 613. Inductor 612 represents the equivalent series inductance (ESL) of the filter capacitor 613. The gate pole, which is formed by the gate capacity of the pass device 601 and by the reciprocal value of the transconductance 1/gm of said input transistor 602 of said current mirror, moves in a constant ratio with the output pole, which is formed by the capacity of the filter capacitor 613 and by the resistance of the load 610.

Compared to the circuit showed in FIG. 3 prior art said preferred embodiment of the present invention shown in FIG. 6 is thus characterized that a serial resistor 620 is added to the gate capacitance of said pass device 601. Instead of said resistor 620 another kind of impedance, e.g. a transistor, could be used as well. In case of low load the resistance of said resistor 620 is not dominating, in case of high load said resistance keeps the gate pole close to the resonance frequency of the output "tank", formed by the capacitor 613 and the equivalent series inductance (ESL) of the filter capacitor 613. As described above said resonance frequency is defined by the equivalent series inductance (ESL) 612 and by the capacitance of the capacitor 613.

Summarizing the characteristics of the embodiments of the present invention shown in FIGS. 4–6 it should be understood that the resistance of the serial resistor 420 respective 520 or 620 is during low load conditions, i.e. low frequencies, small compared to the inner resistance of the gm-buffer 402 respective 502 or the inner resistance input of the current mirror shown in FIG. 6.

With an increase of the load current the inner resistance of the driving stage falls, it keeps the ratio of gate pole to output pole constant. Said ratio has been denominated with "N" above. For a high load the serial resistor dominates and keeps the gate pole close to the resonance frequency of the output "tank", even if the inner resistance of the driving stage goes to zero.

A problem may arise for medium load currents where the inner resistance of the driving stage equals the resistance of the serial resistor 420 respectively 520 or 620. In this case the gate pole could be too low. A possible solution of said problem could be to increase the ratio N of the gate pole to the output pole but this has the disadvantage of a higher current consumption.

Figure 7:
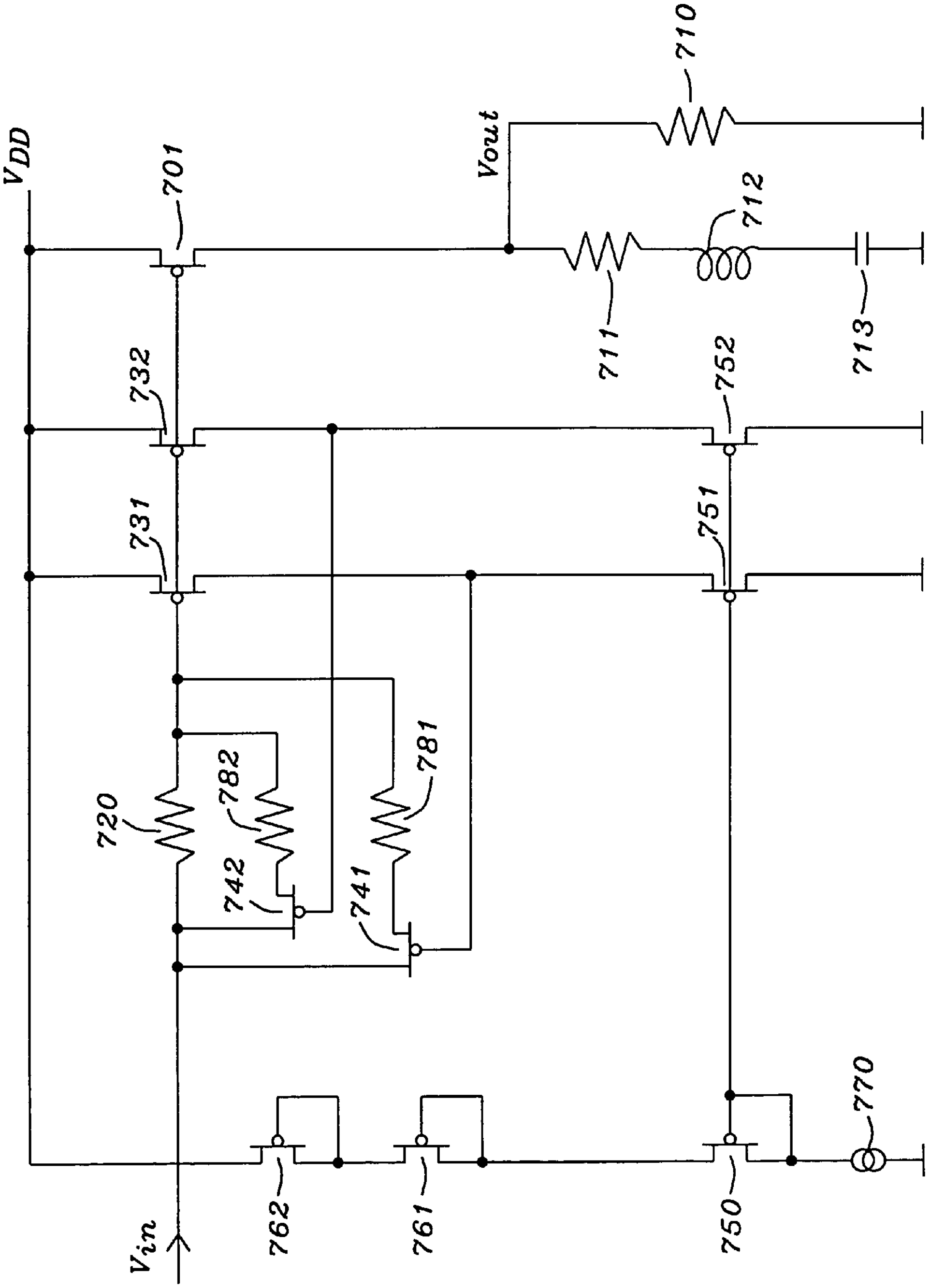
FIG. 7 shows a schematic of a circuitry to perform shunting of an impedance in two steps in case of medium load currents.

FIG. 7 shows another embodiment of the present invention solving the problem of medium loads. $V_{IN}$ represents the input voltage of an adaptive biased driving stage, e.g. a gm-buffer or the gate voltage of an input transistor of a current mirror, and $V_{OUT}$ represents the output voltage of the LDO shown. Equivalent to FIGS. 2–6 resistor 711 represents the equivalent series resistance (ESR) of the filter capacitor 713. 712 represents the equivalent series inductance (ESL) of the filter capacitor 713. 710 represents the load resistance of said LDO. For medium and small loads the serial resistor 720 will be shunted by PMOS switches 742 and 741, saving current consumption of the driver stage 701. The amount of shunting will be defined by the on-resistance of said PMOS switches 742 and 741 or additionally by optional resistors 781 and 782. Transistors 761 and 762 are level shifters. Transistor 750 generates the gate voltage for the transistors 751 and 752.

Transistors 731 and 732 generate currents in a fixed ratio to the output current. In case $$I_{731} < I_{770} \times \frac{L_{750}}{W_{750}} \times \frac{W_{751}}{L_{751}},$$

wherein $I_{731}$ is the current flowing through transistor 731, $I_{770}$ is the current provided by the current source 770, $L_{750}$ is the gate length of transistor 750, $W_{750}$ is the gate width of transistor 750, $L_{751}$ is the gate length of transistor 751, and $W_{751}$ is the gate width of transistor 751, then the gate potential of transistor 741 goes to zero and said transistor 741, acting as a switch, shunts resistor 720.

In the embodiment of the present invention shown in FIG. 7 the resistor 720 is shunted in two steps. In case $$I_{732} < I_{770} \times \frac{L_{750}}{W_{750}} \times \frac{W_{752}}{L_{752}},$$

wherein $I_{732}$ is the current flowing through transistor 732, $I_{770}$ is the current provided by the current source 770, $L_{750}$ is the gate length of transistor 750, $W_{750}$ is the gate width of transistor 750, $L_{752}$ is the gate length of transistor 752, and $W_{752}$ is the gate width of transistor 752, then the gate potential of transistor 742 goes to zero and said transistor 742, acting as a switch, shunts resistor 720 as well. Using different resistance values for the resistors 782 and 781 the total serial gate resistance of the PMOS pass device 701 can be tuned according to the requirements. Thus the serial resistor 720 can be shunted stepwise for different load currents having a medium load order of magnitude. By reducing as described, the gate resistance of the PMOS pass device 701 in case of medium load currents the gate pole can be thus held on the optimum frequency. The ratio N can be reduced as far as possible. Thus the current consumption of the driving stage can be kept to a minimum.

It should be understood that the shunting of the serial gate resistor can be performed by one step only or by more than one step. Shunting in two steps has been shown in FIG. 7 and has been explained above. In case shunting in one step is desired then transistors 732, 752, 742 and the resistor 782 are not required. In case three steps of shunting are desired additional transistors can be deployed in parallel to transistors 732, 752 and 742 and a additional resistor can be deployed in the same way as resistors 781 and 782. It is obvious that more than three steps of shunting can be introduced also by adding correspondent additional transistors and resistors.

Figure 8:
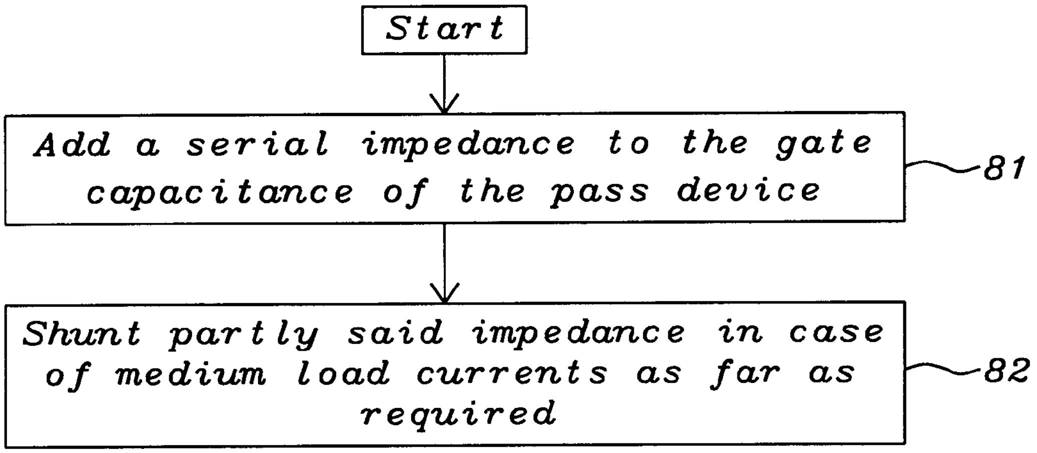
FIG. 8 shows a flowchart of a method to improve the stability of LDOs, having an adaptive biased driving stage.

FIG. 8 shows the basic steps of a method to increase the stability of an LDO comprising a pass device. The first step 81, as described above, comprises to add a serial impedance to the gate capacitance of said pass device. The next step 82 comprises to shunt said impedance partly as far as required in case of medium load currents.

While the invention has been particularly shown and described with reference to the preferred embodiments thereof, it will be understood by those skilled in the art that various changes in form and details may be made without departing from the spirit and scope of the invention.

What is claimed is:

1. A circuit to improve the stability of a low drop-out (LDO) voltage regulator comprising:

a means of an adaptive biased driving stage of said LDO;

an impedance, keeping the gate pole of a pass transistor close to the resonance frequency, being connected on one side to said means of an adaptive biased driving stage and on the other side to the gate of a pass device of said LDO;

said pass device of said LDO, wherein its gate is connected to said impedance and the source and drain are connected to $V_{DD}$ voltage and to the output voltage of said LDO; and a filter capacitor being connected to ground and to the output voltage of said LDO.

2. The circuit of claim 1 wherein said impedance is a resistor.

3. The circuit of claim 1 wherein said impedance is provided by a transistor.

4. The circuit of claim 1 wherein said impedance can be reduced during specific load conditions using an additional parallel impedance.

5. The circuit of claim 4 wherein said specific load condition is a medium load condition.

6. The circuit of claim 4 wherein said parallel impedance is a transistor.

7. The circuit of claim 4 wherein said parallel impedance is a transistor having a serial resistor.

8. The circuit of claim 4 wherein said reduction of said impedance is performed in more than one step depending on the size of the load current.

9. The circuit of claim 8 wherein said reduction of impedance is performed by adding in each step an additional parallel impedance to the first impedance.

10. The circuit of claim 9 wherein said additional parallel impedances are formed by parallel arranged transistors.

11. The circuit of claim 8 wherein said additional parallel impedances are formed by parallel arranged transistors having a serial resistor.

12. The circuit of claim 4 wherein a special circuitry detects said specific load conditions and initiates said reduction of the impedance connected to the gate of said pass device depending on the size of the load current of said LDO.

13. The circuit of claim 12 wherein said specific load condition is a medium load current.

14. The circuit of claim 12, detecting a specific load condition and initiating a reduction of the gate impedance of said pass device in one step, wherein said special circuitry comprises a current source connected to ground and to a first transistor, which is connected via two additional transistors, acting as level shifters to $V_{DD}$ voltage and furthermore the gate of said first transistor is connected to said current source and to the gate of a second transistor, which is connected to ground and to a third transistor, which is connected to VDD, and to the gate of said transistor, being a shunt to the impedance to be reduced, and wherein the gate of said third transistor is connected to the impedance to be reduced.

15. The circuit of claim 12, detecting a specific load condition and initiating a reduction of the gate impedance of said pass device in more than one step, wherein said special circuitry comprises a current source connected to ground and to a first transistor, which is connected via two additional transistors, acting as level shifters to $V_{DD}$ voltage and furthermore the gate of said first transistor is connected to said current source and to the gate of a second transistor, which is connected to ground and to a third transistor, which is connected to VDD, and to the gate of said transistor, being a shunt to the impedance to be reduced, and wherein the gate of said third transistor is connected to the impedance to be reduced, and wherein for each additional step of impedance reduction two additional transistors in parallel to said second and third transistors are introduced, which are controlling the gate of one for each step additional transistor which is an additional shunt to the impedance to be reduced.

16. A method to improve the stability of a low drop-out (LDO) voltage regulator comprising:

providing a pass device for an adaptive biased driving stage;

add a serial impedance to the gate capacitance of said pass device in order to keep the gate pole of said device close to the resonance frequency; and shunt partly said impedance in case of medium load currents as far as required.

17. The method of claim 16 wherein said adaptive biased driving stage is a gm-buffer.

18. The method of claim 16 wherein said adaptive biased driving stage is a current mirror.

19. The method of claim 14 wherein said serial impedance is a transistor.

20. The method of claim 14 wherein said serial impedance is a resistor.

21. The method of claim 14 wherein said serial impedance is shunted by a transistor.

22. The method of claim 14 wherein said serial impedance is shunted by a transistor having a serial resistor.

23. The method of claim 14 wherein said serial impedance is shunted in more than one step.

* * * * *